United States Patent
Hattori et al.

(10) Patent No.: US 11,384,246 B2
(45) Date of Patent: Jul. 12, 2022

(54) NEAR INFRARED ABSORBING DYE, OPTICAL FILTER, AND IMAGING DEVICE

(71) Applicant: AGC Inc., Chiyoda-ku (JP)

(72) Inventors: Shigeki Hattori, Tokyo (JP); Satoshi Okada, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 221 days.

(21) Appl. No.: 16/747,589

(22) Filed: Jan. 21, 2020

(65) Prior Publication Data

US 2020/0148884 A1 May 14, 2020

Related U.S. Application Data

(63) Continuation of application No. PCT/JP2018/025296, filed on Jul. 4, 2018.

(30) Foreign Application Priority Data

Jul. 27, 2017 (JP) ............................. JP2017-145163

(51) Int. Cl.
*G02B 5/20* (2006.01)
*G02B 5/28* (2006.01)
*C09B 23/16* (2006.01)
*G02B 5/22* (2006.01)

(52) U.S. Cl.
CPC ............ *C09B 23/166* (2013.01); *G02B 5/208* (2013.01); *G02B 5/223* (2013.01); *G02B 5/281* (2013.01)

(58) Field of Classification Search
CPC ........ C09B 23/166; G02B 5/208; G02B 5/281
See application file for complete search history.

(56) References Cited

U.S. PATENT DOCUMENTS

| | | | |
|---|---|---|---|
| 2015/0146057 A1 | 5/2015 | Konishi et al. | |
| 2017/0192144 A1* | 7/2017 | Ooi | ............... G02B 5/281 |

FOREIGN PATENT DOCUMENTS

| | | |
|---|---|---|
| CN | 104755969 A | 7/2015 |
| JP | 61-031490 A | 2/1986 |

(Continued)

OTHER PUBLICATIONS

International Search Report dated Oct. 2, 2018 in PCT/JP2018/025296 filed on Jul. 4, 2018 (with English Translation), 5 pages

*Primary Examiner* — Bijan Ahvazi
(74) *Attorney, Agent, or Firm* — Oblon, McClelland, Maier & Neustadt, L.L.P.

(57) ABSTRACT

A near infrared absorbing dye includes a croconium-based compound shown in formula (AI). In formula (AI), ring Z is either an optionally substituted 6-membered ring including no heteroatom or an optionally substituted 5-membered ring including 0 to 3 heteroatoms in the ring, $R^1$ and $R^2$, $R^2$ and $R^3$, and $R^1$ and a carbon atom or heteroatom as a part of ring Z may be linked to each other to respectively form a heteroring A, a heteroring B, and a heteroring C together with a nitrogen atom.

(Continued)

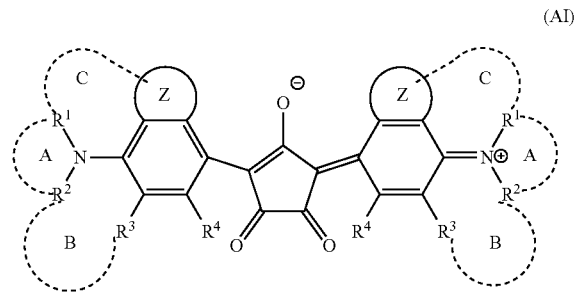

(AI)

19 Claims, 2 Drawing Sheets (56) References Cited

FOREIGN PATENT DOCUMENTS

| JP | 2003-186145 A | | 7/2003 | |
|---|---|---|---|---|
| JP | 2003186145 A | * | 7/2003 | ............. G03C 1/498 |
| JP | 2016-079144 A | | 5/2016 | |
| JP | 2017-068120 A | | 4/2017 | |

* cited by examiner

NEAR INFRARED ABSORBING DYE, OPTICAL FILTER, AND IMAGING DEVICE

TECHNICAL FIELD

The present invention relates to a near-infrared-absorbing dye which transmits visible light and cuts off near-infrared light, an optical filter, and an imaging device equipped with the optical filter.

BACKGROUND ART

Compounds including a croconium framework (hereinafter "croconium compounds") have conventionally been known as near-infrared-absorbing dyes and are utilized in optical-filter applications, in particular, in near-infrared cut filters.

Nowadays, near-infrared cut filters are used in a wide variety of applications, and near-infrared-absorbing dyes for use in the near-infrared cut filters have come to be required to have diversified properties. Under such circumstances, techniques regarding various croconium compounds depending on various required properties have been disclosed (see, for example, Patent Literatures 1 and 2).

CITATION LIST

Patent Literature

Patent Literature 1: JP-A-2016-079144
Patent Literature 2: JP-A-2017-068120

SUMMARY OF INVENTION

Technical Problem

An object of the present invention is to provide a near-infrared-absorbing dye which realizes excellent light-blocking properties in a longer-wavelength near-infrared region and which has high visible-light-transmitting properties, and to provide an optical filter and an imaging device which employs the optical filter and has excellent color reproduction properties.

Solution to the Problem

The present invention provides a near-infrared-absorbing dye including a croconium compound represented by formula (AI) (hereinafter, the dye is referred to also as "near-infrared-absorbing dye (AI)").

[Chem. 1]

(AI)

In formula (AI), ring Z is an optionally substituted 6-membered ring including no heteroatom or an optionally substituted 5-membered ring including 0 to 3 heteroatoms in the ring, $R^1$ and $R^2$, $R^2$ and $R^3$, and $R^1$ and a carbon atom or heteroatom as a part of ring Z may be linked to each other to respectively form a heteroring A, a heteroring B, and a heteroring C together with a nitrogen atom; in a case where the heteroring(s) is not formed, $R^1$ and $R^2$ each independently represent a hydrogen atom or a hydrocarbon group which may contain an unsaturated bond, a heteroatom, or a saturated or unsaturated ring structure between carbon atoms and which may be substituted, and $R^3$ each independently represents a hydrogen atom, a halogen atom, a hydroxyl group, or an alkyl or alkoxy group which may contain a heteroatom between carbon atoms, and $R^4$ each independently represents a hydrogen atom, a halogen atom, a hydroxyl group, or an alkyl or alkoxy group which may contain a heteroatom between carbon atoms.

The optical filter in the present invention includes an absorption layer which includes the near-infrared-absorbing dye (AI) and a resin.

The imaging device in the present invention includes a solid imaging element, an imaging lens, and the optical filter.

Advantageous Effects of the Invention

The present invention can provide a near-infrared-absorbing dye which realizes excellent light-blocking properties in a longer-wavelength near-infrared region and which has high visible-light-transmitting properties. The present invention can further provide an optical filter employing the dye and an imaging device which employs the optical filter and has excellent color reproduction properties.

DESCRIPTION OF EMBODIMENTS

Embodiments of the present invention are explained below.

In this description, a near-infrared-absorbing dye is sometimes abbreviated to "NIR dye" and an ultraviolet-absorbing dye is sometimes abbreviated to "UV dye".

In this description, an NIR dye including a compound represented by formula (AI) is referred to also as an NIR dye (AI), and the same applies to other dyes (for example, an NIR dye including a compound represented by formula (A1-1) which will be described later is referred to also as an NIR dye (A1-1)). Furthermore, a group represented by, for example, formula (1n) is referred to also as a group (1n), and the same applies to groups represented by other formulae.

<NIR Dye (AI)>

The NIR dye (AI) of the present invention includes a croconium compound including a molecular structure which includes a croconium framework lying at the center and two benzene rings bonded to the croconium framework respectively on the left-hand side and right-hand side thereof and in which the benzene rings each have a nitrogen atom bonded thereto at the 4-position and each form a fused-ring structure together with a hydrocarbon ring or heteroring including the 2-position and 3-position carbon atoms of the benzene ring.

[Chem. 2]

(AI)

In formula (AI), ring Z is an optionally substituted 6-membered ring including no heteroatom or an optionally substituted 5-membered ring including 0 to 3 heteroatoms in the ring.

Ring Z may be an aromatic ring or an aliphatic ring, and is preferably an aromatic ring. In the case where ring Z is a 5-membered ring, each heteroatom may be any of nitrogen, sulfur, and oxygen atoms, but nitrogen and sulfur atoms are preferred from the standpoint of heightening the visible-light transmittance. Examples of ring Z include a pyrrolidine ring, a pyrrole ring, a thiophene ring, an imidazole ring, a pyrazole ring, a thiazole ring, an isothiazole ring, an oxazole ring, an isoxazole ring, and a triazole ring.

Preferred examples of ring Z among these are rings in which electrons of the heteroatom(s) can be delocalized to provide the effect of stabilizing the ground-state energy level of an unshared electron pair and which hence have the property of improving the visible-light transmittance. Specifically, ring Z preferably is an aromatic heteroring. In particular, a pyrrole ring, an imidazole ring, a pyrazole ring, and a triazole ring are preferred.

Furthermore, ring Z preferably is a pyrrole, imidazole, pyrazole, or triazole ring which has a configuration in which the hydrogen atom of the —NH— contained as a part of the ring remains unreplaced and the nitrogen atom of the —NH— is bonded to a 2-position carbon atom of a benzene ring bonded to the croconium framework.

In ring Z, one or more of the hydrogen atoms each bonded to any of the carbon and nitrogen atoms constituting ring Z each may be replaced with a substituent such as, for example, a halogen atom, a hydroxyl group, a carboxyl group, a sulfo group, a cyano group, an amino group, an N-substituted amino group, a nitro group, an alkoxycarbonyl group, a carbamoyl group, an N-substituted carbamoyl group, an imide group, or an alkyl or alkoxy group including 1 to 12 carbon atoms. The hydrogen atoms of the alkyl or alkoxy group including 1 to 12 carbon atoms may be replaced with halogen atoms, etc. It is preferable that the hydrogen atom bonded to a nitrogen atom as a part of ring Z is not replaced.

Examples of the halogen atoms include fluorine, chlorine, bromine, and iodine atoms. Examples of the halogen atoms which will be mentioned in the explanations below include the same atoms. The alkyl group and the alkyl group constituting the alkoxy group may be linear, branched, or cyclic or may be a combination of two or more of these.

These alkyl groups may contain unsaturated bonds. The substituent is preferably a long-chain alkyl group including 4 to 12 carbon atoms, from the standpoint of solubility in resins, e.g., transparent resins for use in the absorption layer which will be described later, and is preferably a highly electron-attracting substituent, such as a halogen atom or a sulfo, cyano, nitro, trifluoromethyl, or carbamoyl group, from the standpoint of heightening the visible-light transmittance.

In formula (AI), $R^1$ and $R^2$, $R^2$ and $R^3$, and $R^1$ and a carbon atom or heteroatom (nitrogen atom) as a part of ring Z may be linked to each other to respectively form a heteroring A, a heteroring B, and a heteroring C together with the nitrogen atom bonded to the 4-position of the benzene ring. In formula (AI), all of heteroring A, heteroring B, and heteroring C may be formed or one or two of these may be formed. In formula (AI) including one or more heterorings, it is preferable that heteroring A and heteroring B are 3- to 6-membered heterorings and that the heteroring C is a 5- or 6-membered heteroring. Hereinafter, "heteroring A" is referred to also as "ring A", and the same applies to heteroring B and heteroring C.

Examples of ring A and ring B include an aziridine ring, an azetidine ring, a pyrrolidine ring, a piperidine ring, a piperazine ring, and a morpholine ring. Examples of the ring C include a pyrrolidine ring, a piperidine ring, a piperazine ring, and a morpholine ring.

In each of rings A, B, and C, one or more of the hydrogen atoms bonded to the carbon atoms or nitrogen atoms as parts of the ring each may be replaced with a substituent such as a halogen atom, a hydroxyl group, a carboxy group, a sulfo group, a cyano group, an amino group, an N-substituted amino group, a nitro group, an alkoxycarbonyl group, a carbamoyl group, an N-substituted carbamoyl group, an imide group, an alkyl group including 1 to 12 carbon atoms, or an alkoxy group including 1 to 12 carbon atoms. The alkyl group and the alkyl group constituting the alkoxy group may be linear, branched, or cyclic or may be a combination of two or more of these.

$R^1$ and $R^2$ not forming a heteroring each independently represent a hydrogen atom or a hydrocarbon group that may contain an unsaturated bond, a heteroatom (e.g., an oxygen atom), or a saturated or unsaturated ring structure between carbon atoms and may be substituted, and the hydrocarbon group preferably includes 1 to 20 carbon atoms. Examples of substituents include halogen atoms, a hydroxyl group, a carboxy group, a sulfo group, a cyano group, an amino group, N-substituted amino groups, a nitro group, alkoxycarbonyl groups, a carbamoyl group, N-substituted carbamoyl groups, imide groups, alkyl groups including 1 to 12 carbon atoms, and alkoxy groups including 1 to 12 carbon atoms.

The alkyl groups and the alkyl groups constituting the alkoxy groups each may be linear, branched, or cyclic or may be a combination of two or more of these. Hydrogen atoms of the alkyl or alkoxy groups may be replaced with halogen atoms, etc. From the standpoints of visible-light-transmitting property, solubility in resins, etc., $R^1$ and $R^2$ not forming a heteroring are each preferably an alkyl group including 1 to 20 carbon atoms which may be branched and may contain a heteroatom between carbon atoms, more preferably the alkyl group including 1 to 12 carbon atoms, even more preferably the alkyl group including 2 to 8 carbon atoms.

$R^3$ not forming a heteroring and $R^4$ each independently represent a hydrogen atom, a halogen atom, a hydroxyl group, or an alkyl or alkoxy group, preferably an alkyl or alkoxy group including 1 to 20 carbon atoms. The alkyl group and the alkyl group constituting the alkoxy group may be linear, branched, or cyclic or may be a combination of two or more of these. Hydrogen atoms of the alkyl or alkoxy group may be replaced with halogen atoms, etc. $R^3$ is preferably a hydrogen atom, a halogen atom, or an alkyl group, more preferably a hydrogen atom or an alkyl group. $R^4$ is preferably a hydrogen atom or a halogen atom, especially preferably a hydrogen atom, from the standpoint of steepness in an absorption spectrum, in particular, the steepness of a change around the boundary between the visible region and the near-infrared region.

In this description, the term "saturated or unsaturated ring structure" means a hydrocarbon ring or a heteroring including an oxygen atom as a ring-constituting atom, unless otherwise indicated. In this case, structures in which an alkyl group including 1 to 10 carbon atoms is bonded to one of the ring-constituting carbon atoms are included in the scope of the term.

In formula (AI), $R^1$ to $R^4$, which are possessed by each of the benzene rings bonded to the croconium framework respectively on the left-hand side and right-hand side thereof, and ring Z, which adjoins each benzene ring to form a fused ring, may differ between the left-hand side and the right-hand side. However, it is preferable that $R^1$ to $R^4$ and ring Z on one side are the same as those on the other side, from the standpoint of productivity.

The compound represented by formula (AI) is the same as the compound represented by formula (AI-1). The symbols in formula (AI-1) have the same meanings as in formula (AI).

[Chem. 3]

(AI-1)

The NIR dye (AI) has a structure including a specific 5-membered or 6-membered ring fused at the 2- and 3-positions of each of the benzene rings bonded to the croconium framework respectively on the left-hand side and right-hand side thereof. Due to this structure, the NIR dye (AI) highly absorbs near-infrared light in longer-wavelength-side and has a high visible-light transmittance, in particular, a high transmittance for shorter-wavelength-side blue components of visible light.

The NIR dye (AI) has, for example, absorption characteristics of the maximum-absorption wavelength $\lambda_{max(AI)}$ being within a range of from 800 to 1,000 nm in the absorption spectrum over a wavelength range of from 400 to 1,100 nm measured after dissolving the near-infrared-absorbing dye (AI) into dichloromethane. The NIR dye (AI) may be made to have absorption characteristics including a maximum-absorption wavelength λmax(AI) being within the narrower range of from 850 to 1,000 nm, and to have absorption characteristics including a maximum-absorption wavelength $\lambda_{max(AI)}$ being within the even narrower range of from 880 to 980 nm. Such absorption characteristics are suitable characteristics for use in absorption layers for ambient-light sensors which are required to have an absorption maximum, for example, within a range of from 850 to 1,050 nm.

A dichloromethane solution, when the dichloromethane solution has a regulated concentration of the NIR dye (AI) so as to have a transmittance of light at the maximum-absorption wavelength $\lambda_{max(AI)}$ of the NIR dye (AI) being 10%, preferably has an average transmittance of light having a wavelength of from 430 to 480 nm being 90% or higher, more preferably 92% or higher, still more preferably 93% or higher. Furthermore, a dichloromethane solution, when the dichloromethane solution has a regulated concentration of the NIR dye (AI) so as to have a transmittance of light at the maximum-absorption wavelength $\lambda_{max(AI)}$ of the NIR dye (AI) being 10%, preferably has an average transmittance of light having a wavelength of from 410 to 480 nm being 90% or higher, more preferably 92% or higher, still more preferably 93% or higher.

The above effect of the absorption characteristics of the NIR dye (AI) is considered to be attributable to the enhanced molecular planeness obtained by converting each benzene ring into a fused ring, in particularly, a ring fused with a heteroring. Furthermore, in the case where the fused ring is an aromatic heteroring, the electrons of the heteroatom can be delocalized and, hence, the visible-light transmittance can be further heightened.

The NIR dye (AI) has satisfactory solubility in organic solvents and satisfactory compatibility with resins. As a result, this dye has excellent spectral transmittance characteristics even when the absorption layer has a reduced thickness, which can reduce the thickness of optical filters. This absorption layer can hence be inhibited from expanding upon heating. Because of this, when heat treatments are conducted in forming functional layers such as, for example, a reflection layer and an anti-reflection layer over the absorption layer, these layers can be inhibited from suffering cracking, etc.

Examples of the NIR dye (AI) include dyes including compounds represented by formulae (A11) to (A15), (A21) to (A27), and (A31) to (A34).

[Chem. 4]

(A11)

(A12)

-continued

(A13)

(A14)

(A15)

[Chem. 5]

(A21)

(A22)

(A23)

-continued (A24)

[Chem. 6]

(A25)

(A26)

(A27)

[Chem. 7]

(A31)

(A32)

-continued (A33)

(A34)

R[1], R[2], R[3], and R[4] in formulae (A11) to (A15) have the same meanings as R[1], R[2], R[3], and R[4] in formula (AI) which include none of rings A, B, and C. R[3] and R[4] in formulae (A21) to (A27) have the same meanings as R[3] and R[4] in formula (AI) which do not include ring C. R[1] and R[4] in formulae (A31) to (A34) have the same meanings as R[1] and R[4] in formula (AI) which include neither ring A nor ring C.

R[5] in each of formulae (A11) to (A14), (A21) to (A26), and (A31) to (A33) each independently is selected from among a hydrogen atom, halogen atoms, a hydroxyl group, a carboxy group, a sulfo group, a cyano group, an amino group, N-substituted amino groups, a nitro group, alkoxycarbonyl groups, a carbamoyl group, N-substituted carbamoyl groups, imide groups, alkyl groups including 1 to 12 carbon atoms, and alkoxy groups including 1 to 12 carbon atoms. The alkyl groups and the alkyl groups constituting the alkoxy groups each may be linear, branched, or cyclic or a combination of two or more of these, and may contain an unsaturated bond. Hydrogen atoms of the alkyl or alkoxy groups may be replaced with halogen atoms, etc. Furthermore, the divalent groups Q in formulae (A21) to (A27) each represent a divalent group formed by the R[1] and R[2] bonded to each other in the case where formula (AI) includes rings A. The divalent groups X[1] in formulae (A31) to (A34) each represent a divalent group formed by the R[2] and R[3] bonded to each other in the case where formula (AI) includes rings B.

In formulae (A11) to (A15), R[1] and R[2] each independently are preferably an alkyl group which includes 1 to 20 carbon atoms and which may contain a heteroatom between carbon atoms, from the standpoints of visible-light-transmitting property, solubility in resins, etc., and are more preferably an alkyl group which includes 2 to 12 carbon atoms and which may contain a heteroatom between carbon atoms, examples of which are groups (1a) to (5a).

[Chem. 8]

(1a)

(2a)

(3a)

(4a)

(5a)

In formulae (A11) to (A15) and (A21) to (A27), R[3] each independently is preferably a hydrogen atom, a halogen atom, or an alkyl or alkoxy group including 1 to 3 carbon atoms (e.g., methyl, ethyl, methoxy, or ethoxy), more preferably a hydrogen atom, a halogen atom, or a methyl group, from the standpoints of solubility in resins, visible-light-transmitting property, etc. Hydrogen atoms of the alkyl or alkoxy group may be replaced with halogen atoms, etc. R[4] is preferably a hydrogen atom or a halogen atom, especially preferably a hydrogen atom, from the standpoint of the steepness of a change around the boundary between the visible region and the near-infrared region.

R[5] in formulae (A11) to (A14), (A21) to (A26), and (A31) to (A33) each independently is preferably a hydrogen atom, a halogen atom, a nitro group, a trifluoromethyl group, a cyano group, or an alkoxycarbonyl group, more preferably a hydrogen atom, a nitro group, or a trifluoromethyl group.

Examples of the divalent groups Q in formulae (A21) to (A27) include alkylene or alkyleneoxy groups which include 3 to 8 carbon atoms and in which the hydrogen atoms each may be replaced with an alkyl group including 1 to 10 carbon atoms, an aryl group including 6 to 10 carbon atoms, or an optionally substituted acyloxy group including 1 to 10 carbon atoms. In the case of the alkyleneoxy group, it is preferable that the oxygen atom is not adjacent to the N. Especially preferred examples of the divalent groups Q are alkylene groups including 3 to 5 carbon atoms.

In formulae (A31) to (A34), preferred examples of the divalent groups X[1] are the same as those of the divalent groups Q described above. In formulae (A31) to (A34), R[1] each independently is preferably an alkyl group which includes 1 to 12 carbon atoms and which may be branched and may contain a heteroatom between carbon atoms, more preferably the alkyl group including 2 to 8 carbon atoms, from the standpoints of solubility in resins, visible-light-transmitting property, etc. R[4] in these formulae is preferably a hydrogen atom or a halogen atom, especially preferably a hydrogen atom.

Preferred examples of the NIR dye (AI) are shown in Table 1. The specific structures of R[1] and R[2] shown in Table 1 correspond to formulae (1a) to (5a). In each of dyes (A1-1) to (A1-19), two R[1], which are one left-hand-side R[1] and one right-hand-side R[1], are equal to each other, and the same applies to R[2] to R[5]. The same also applies to Q and R[3] to R[5] in dyes (A2-1) to (A2-8) and R[1], X[1], R[4], and R[5] in dyes (A3-1) to (A3-5). In Q in each of dyes (A2-1) to (A2-8) and in X[1] in each of dyes (A3-1) to (A3-5), the left-hand-side linking bond is bonded to the nitrogen atom and the right-hand-side linking bond is bonded to a carbon atom of the benzene ring. In dye (A3-3), the expression "H, —CH$_3$" for R[5] means that H and —CH$_3$ are bonded in this order from the side nearer to the NH.

TABLE 1

| Abbreviation of dye | Structural formula | $R^1$ | $R^2$ | Q | $R^3$ | $X^1$ | $R^4$ | $R^5$ |
|---|---|---|---|---|---|---|---|---|
| A1-1 | A11 | (1a) | (1a) | — | H | — | H | H |
| A1-2 | | (1a) | (1a) | — | H | — | H | —C(CH$_3$)$_3$ |
| A1-3 | | (1a) | (1a) | — | H | — | H | —CF$_3$ |
| A1-4 | | (1a) | (1a) | — | H | — | H | —CH$_3$ |
| A1-5 | | (1a) | (1a) | — | H | — | H | —C$_8$H$_{17}$ |
| A1-6 | | (2a) | (2a) | — | H | — | H | H |
| A1-7 | | (3a) | (3a) | — | H | — | H | H |
| A1-8 | | (4a) | (4a) | — | H | — | H | H |
| A1-9 | | (5a) | (5a) | — | H | — | H | H |
| A1-10 | | (1a) | —C$_2$H$_5$ | — | H | — | H | H |
| A1-11 | | —(CH$_2$)$_5$CH$_3$ | —(CH$_2$)$_3$CH$_3$ | — | H | — | H | H |
| A1-12 | A12 | (1a) | (1a) | — | H | — | H | H, H |
| A1-13 | A13 | (1a) | (1a) | — | H | — | H | H |
| A1-14 | A14 | (2a) | (2a) | — | H | — | H | H |
| A1-15 | | (1a) | (1a) | — | H | — | H | H |
| A1-16 | | (3a) | (3a) | — | H | — | H | H |
| A1-17 | | (4a) | (4a) | — | H | — | H | H |
| A1-18 | | (5a) | (5a) | — | H | — | H | H |
| A1-19 | A15 | (1a) | (1a) | — | H | — | H | — |
| A2-1 | A21 | — | — | —(CH$_2$)$_4$— | H | — | H | H |
| A2-2 | | — | — | —(CH$_2$)$_4$— | H | — | H | —C$_6$H$_{13}$ |
| A2-3 | A22 | — | — | —(CH$_2$)$_4$— | H | — | H | H |
| A2-4 | A23 | — | — | —(CH$_2$)$_4$— | H | — | H | H |
| A2-5 | A24 | — | — | —(CH$_2$)$_4$— | H | — | H | H |
| A2-6 | A25 | — | — | —(CH$_2$)$_4$— | H | — | F | —CH$_3$ |
| A2-7 | A26 | — | — | —(CH$_2$)$_4$— | H | — | H | H |
| A2-8 | A27 | — | — | —(CH$_2$)$_4$— | H | — | H | — |
| A3-1 | A31 | —CH$_2$CH$_3$ | — | — | — | —CH(CH$_3$)—C(CH$_3$)$_2$— | H | H |
| A3-2 | A32 | —CH$_2$CH$_3$ | — | — | — | —CH(CH$_3$)—C(CH$_3$)$_2$— | H | H, H |
| A3-3 | | —CH$_2$CH$_3$ | — | — | — | —CH(CH$_3$)—C(CH$_3$)$_2$— | H | H, —CH$_3$ |
| A3-4 | A33 | —CH$_2$CH$_3$ | — | — | — | —CH(CH$_3$)—C(CH$_3$)$_2$— | H | H |
| A3-5 | A34 | —CH$_2$CH$_3$ | — | — | — | —CH(CH$_3$)—C(CH$_3$)$_2$— | H | — |

The NIR dye (AI) can be produced, for example, by the methods described in U.S. Patent Application Publication No. 2014/0061505 and International Publication WO 2014/088063. Specifically, the NIR dye (AI) can be produced by reacting 4,5-dihydroxy-4-cyclopentene-1,2,3-trione (croconic acid) with a compound including a fused ring and capable of combining with croconic acid to form a structure represented by formula (AI). For example, in the case where the NIR dye (AI) has a symmetrical structure, a compound including a fused ring of a desired structure within the range shown above should be reacted in an amount of 2 equivalents to the croconic acid.

A specific example of a reaction path for obtaining an NIR dye (A11) is shown below. In the following scheme (F1), croconic acid is indicated by (s). In scheme (F1), a substituted amino group including desired substituents ($R^1$, $R^2$) is introduced onto the benzene ring of a benzothiadiazole compound (a) having desired substituents ($R^3$, $R^4$), and the resultant compound (c) is reduced to obtain a phenylenediamine compound (d). Furthermore, a carboxylic acid (e) or aldehyde (f) which includes a desired substituent $R^5$ is reacted with the phenylenediamine compound (d) to obtain a benzimidazole compound (g). The benzimidazole compound (g) is reacted with croconic acid (s) in an amount of 2 equivalents to the croconic acid to obtain a dye (A11).

[Chem. 9]

(a)

(b)

(F1)

In scheme (F1), $R^1$ to $R^5$ have the same meanings as the $R^1$ to $R^5$ in formula (A11), Bu represents butyl, t-Bu represents t-butyl, Ph represents phenyl, HBraq. represents hydrobromic acid, and THF represents tetrahydrofuran. Hereinafter, Me represents methyl and Et represents ethyl. In this description, Me, Et, Bu, t-Bu, Ph, HBraq., and THF have the same meanings as shown above, when used hereinafter.

Applications of the NIR dye (AI) of the present invention are not particularly limited. For example, the dye is applicable to optical filters for cutting off near-infrared light, in particular, near-infrared light having a relatively longer wavelength. The dye is applicable also to absorption layers for use in ambient-light sensors as described above.

<Optical Filter>

An optical filter according to one embodiment of the present invention (hereinafter referred to also as "this filter") includes an absorption layer including the NIR dye (AI) of the present invention and a resin. So long as this filter includes the absorption layer including the NIR dye (AI) and a resin, the other configuration of this filter is not particularly limited. For example, this filter may be an optical filter including a resinous base constituted only of the absorption layer.

Figure 1A:
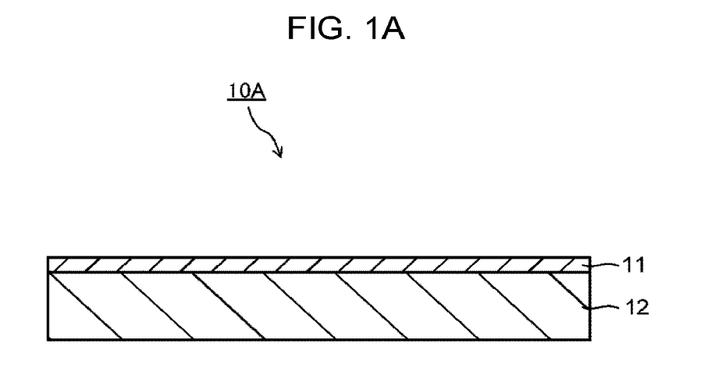
FIG. 1A is a cross-sectional view schematically illustrating an example of an optical filter according to an embodiment.

This filter may, for example, have a configuration which includes a transparent substrate and in which the absorption layer is formed on the transparent substrate. FIG. 1A is a cross-sectional view schematically illustrating an example of an optical filter according to this embodiment. The optical filter 10A includes a transparent substrate 12 and an absorption layer 11 disposed on one of the main surfaces of the transparent substrate 12. In the optical filter 10A, the absorption layer 11 can be constituted of an absorption layer including the NIR dye (AI) and a resin.

Figure 1B:
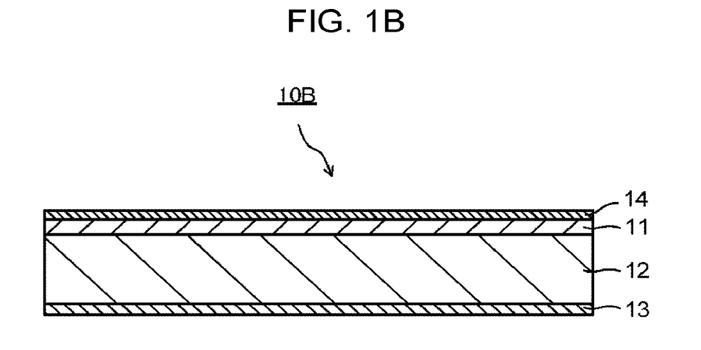
FIG. 1B is a cross-sectional view schematically illustrating another example of the optical filter according to an embodiment.

This filter may include a reflection layer including a dielectric multilayer film. In this case, this filter may have a configuration including a transparent substrate or a configuration including no transparent substrate. In the case where this filter includes no transparent substrate, this filter may have a configuration in which the absorption layer itself functions as a base (i.e., a dye-containing resinous base). FIG. 1B is a cross-sectional view schematically illustrating one example of an optical filter according to an embodiment which includes a transparent substrate, an absorption layer, and a reflection layer. The optical filter 10B includes a transparent substrate 12, an absorption layer 11 disposed on one of the main surfaces of the transparent substrate 12, and a reflection layer 13 disposed on the other main surface of the transparent substrate 12. In the optical filter 10B, the absorption layer 11 can be constituted of an absorption layer including the NIR dye (AI) and a resin. The optical filter 10B further includes an anti-reflection layer 14 formed on the main surface of the absorption layer 11 which is on the side opposite to the transparent substrate 12.

In the case where this filter has a configuration including an absorption layer, a reflection layer, and a transparent substrate, the sequence of layer stacking is not limited to that in the optical filter 10B. For example, the absorption layer and the reflection layer may be disposed over the same main surface of the transparent substrate. In this case, the sequence of stacking of these layers is not particularly limited. The optical filter 10B may have a configuration which includes no anti-reflection layer 14, and may have other functional layers. Constituent elements (including optional constituent elements) of this filter are explained below.

(Absorption Layer)

The absorption layer contains one or more NIR dyes (AI). The absorption layer may further contain NIR dyes (hereinafter referred to as "other NIR dyes") other than the NIR dyes (AI), so long as the inclusion thereof does not lessen the effects of the present invention.

The content of the NIR dyes (AI) in the absorption layer is preferably such that the total content of the NIR dyes (AI) and the other NIR dyes is 0.1 to 30 parts by mass per 100 parts by mass of the resin. In the case where the total content thereof is 0.1 part by mass or more, a desired near-infrared-absorbing ability is obtained. In the case where the total content thereof is 30 parts by mass or less, a decrease in near-infrared-absorbing ability and an increase in haze, etc. are prevented. The total content of the NIR dyes (AI) and the other NIR dyes is more preferably 0.5 to 25 parts by mass, even more preferably 1 to 20 parts by mass. In the case where the absorption layer contains one or more NIR dyes (AI) as the only NIR dye(s), the content thereof can be the same as the total content of NIR dyes shown above.

Examples of the other NIR dyes include NIR dyes which have a maximum-absorption wavelength on the shorter-wavelength side of the maximum-absorption wavelength $\lambda_{max(AI)}$ of the NIR dye (AI). Specific examples thereof include an NIR dye (AII) having, in an absorption spectrum over the wavelength range of 400 to 1,100 nm measured after dissolving the NIR dye (AII) into dichloromethane, a maximum-absorption wavelength $\lambda_{max(AII)}$ being within a range of 660 nm or longer and [(maximum-absorption wavelength $\lambda_{max(AI)}$ of the NIR dye (AI))−30] nm or shorter. In the case of using two or more NIR dyes in order to obtain a wide absorption range, the maximum-absorption wavelength $\lambda_{max(AII)}$ of the NIR dye (AII) is preferably within a range of $\lambda_{max(AI)}$-50 nm or shorter, more preferably $\lambda_{max(AI)}$-80 nm or shorter, even more preferably $\lambda_{max(AI)}$-100 nm or shorter.

Examples of the other NIR dyes further include NIR dyes which have a maximum-absorption wavelength on the longer-wavelength side of the maximum-absorption wavelength $\lambda_{max(AI)}$ of the NIR dye (AI). Specific examples thereof include an NIR dye (AIII) having, in an absorption spectrum over the wavelength range of 400 to 1,100 nm measured after dissolving the NIR dye (AIII) into dichloromethane, a maximum-absorption wavelength $\lambda_{max(AIII)}$ being within a range of [(maximum-absorption wavelength $\lambda_{max(AI)}$ of the NIR dye (AI))+30] nm or longer and 1,100 nm or shorter. In the case of using two or more NIR dyes in order to obtain a wide absorption range, the maximum-absorption wavelength $\lambda_{max(AIII)}$ the NIR dye (AIII) is preferably within a range of $\lambda_{max(AI)}$+50 nm or longer, more preferably $\lambda_{max(AI)}$+80 nm or longer, even more preferably $\lambda_{max(AI)}$+100 nm or longer.

Examples of the NIR dye (AII) include the following compounds which have a maximum-absorption wavelength $\lambda_{max(AII)}$ within the above-described range: cyanine-based compounds; phthalocyanine-based compounds; naphthalocyanine-based compounds; dithiol metal complex compounds; diimonium-based compounds; polymethine-based compounds; phthalide compounds; naphthoquinone-based compounds; anthraquinone-based compounds; indophenol-based compounds; and squarylium-based compounds.

Examples of the NIR dye (AIII) include the following compounds which have a maximum-absorption wavelength $\lambda_{max(AIII)}$ within the above-described range: cyanine-based compounds; phthalocyanine-based compounds; naphthalocyanine-based compounds; dithiol metal complex compounds; diimonium-based compounds; polymethine-based compounds; phthalide compounds; naphthoquinone-based compounds; anthraquinone-based compounds; indophenol-based compounds; and squarylium-based compounds. A single NIR dye (AII) and a single NIR dye (AIII) may be used, or a mixture of two or more NIR dyes (AII) and a mixture of two or more NIR dyes (AIII) may be used.

The absorption layer includes the NIR dye (AI) and a resin, and typically is a layer or (resinous) base in which the NIR dye (AI) is evenly dissolved or dispersed in the resin. The resin usually is a transparent resin. The absorption layer may contain other NIR dyes other than the NIR dye (AI). The absorption layer may further contain a dye other than NIR dyes, in particular a UV dye.

Examples of the UV dye include dyes such as oxazole-based compounds, merocyanine-based compounds, cyanine-based compounds, naphthalimide-based compounds, oxadiazole-based compounds, oxazine-based compounds, oxazolidine-based compounds, naphthalic-acid-based compounds, styryl-based compounds, anthracene-based compounds, cyclic carbonyl compounds, and triazole-based compounds. Among these, the dyes including an oxazole-based compound or merocyanine-based compound are preferred. In the absorption layer, a single UV dye may be used or two or more UV dyes may be used in combination.

Examples of the transparent resin include acrylic resins, epoxy resins, ene-thiol resins, polycarbonate resins, polyether resins, polyarylate resins, polysulfone resins, polyethersulfone resins, poly-p-phenylene resins, poly(arylene ether phosphine oxide) resins, polyimide resins, poly(amide-imide) resins, polyolefin resins, cycloolefin resins, and polyester resins such as poly(ethylene terephthalate) resins and poly(ethylene naphthalate) resins. One of these resins may be used alone, or a mixture of two or more thereof may be used.

From the standpoints of transparency, the solubility of the NIR dye (AI), and heat resistance, the transparent resin is preferably a resin having a high glass transition point (Tg). Specifically, one or more resins selected from among polyester resins, polycarbonate resins, polyethersulfone resins, polyarylate resins, polyimide resins, and epoxy resins are preferred. One or more resins selected from among polyester resins and polyimide resins are more preferred.

The absorption layer may further contain optional ingredients such as, for example, an adhesiveness-imparting agent, color tone correcting dye, leveling agent, antistatic agent, heat stabilizer, light stabilizer, antioxidant, dispersant, flame retardant, lubricant, and plasticizer, so long as the inclusion thereof does not lessen the effects of the present invention.

The absorption layer can be formed, for example, by dissolving or dispersing dyes including the NIR dye (AI), a resin or a raw-material ingredient for a resin and optional ingredients contained as needed in a medium to prepare a coating fluid, applying the coating fluid to a substrate and drying, and optionally curing the applied coating fluid. The substrate may be either the transparent substrate optionally included in this filter or a substrate having release properties which is used only for forming the absorption layer. The medium may be a dispersion medium in which the ingredients can be stably dispersed or a medium in which the ingredients can be stably dissolved.

The coating fluid may contain a surfactant for mitigating problems such as the formation of voids due to minute bubbles, depressions due to the adhesion of foreign substances, and cissing in the drying step. For applying the coating fluid, dip coating, cast coating, spin coating or the like can be used. After application of the coating fluid to a substrate, the applied coating fluid is dried. Thus, the absorption layer is formed. In the case where the coating fluid contains the raw-material ingredient for a resin, a curing treatment such as thermal curing or photocuring is further performed.

The absorption layer can be produced in a film form by extrusion molding, and this film may be stacked on another member and integrated therewith by press bonding with heating, etc. For example, in the case where this filter includes a transparent substrate, this film may be adhered to a surface of the transparent substrate.

This filter may include two or more absorption layers. In the configuration including two or more absorption layers, these layers may be the same or different. Examples of the configuration including two or more absorption layers include a configuration in which one absorption layer is a near-infrared-absorbing layer including an NIR dye and a resin and another absorption layer is an ultraviolet-absorbing layer including a UV dye and a resin. Also in such case where two or more absorption layers are included, the absorption layers themselves may be a base (resinous base).

In this filter, the absorption layer preferably has a thickness of 0.1 µm to 100 µm. In the case where the absorption layer is composed of a plurality of layers, the total thickness of these layers is preferably 0.1 µm to 100 µm. In the case where the thickness thereof is less than 0.1 µm, this filter might not sufficiently exhibit the desired optical properties.

In the case where the thickness thereof exceeds 100 µm, the layer might have reduced flatness, resulting in in-plane unevenness in absorptivity. The thickness of the absorption layer is more preferably 0.3 µm to 50 µm. In the case where this filter includes other functional layers, such as a reflection layer and an anti-reflection layer, too large absorption layer thicknesses may arouse troubles such as cracking, depending on the materials of the functional layers. Consequently, the thickness of the absorption layer is more preferably 0.3 µm to 10 µm.

(Transparent Substrate)

In this filter, a transparent substrate is an optional constituent element. In the case where this filter includes a transparent substrate, the thickness of the transparent substrate is preferably 0.03 mm to 5 mm, and is more preferably 0.05 mm to 1 mm from the standpoint of thickness reduction. The constituent material of the transparent substrate may be any of glasses, (birefringent) crystals, and various resins such as polyimide resins, so long as these materials transmit visible light.

Examples of the glasses for use as the transparent substrate include: absorbing glasses (near-infrared-absorbing glasses) obtained by adding CuO, etc. to fluorophosphate glasses, phosphate glasses, or the like; soda-lime glasses; borosilicate glasses; alkali-free glasses; and quartz glass. The term "phosphate glass" also includes a silicophosphate glass in which some of the glass framework is constituted of $SiO_2$.

In the case where the glass to be used as the transparent substrate is a fluorophosphate glass, this glass specifically preferably contains, in terms of cation %, 20 to 45% $P^{5+}$, 1 to 25% $Al^{3+}$, 1 to 30% $R^+$ (where $R^+$ is at least one of $Li^+$, $Na^+$, and $K^+$; the value is the total content of these), 1 to 20% $Cu^{2+}$, and 1 to 50% $R^{2+}$ (where $R^{2+}$ is at least one of $Mg^{2+}$, $Ca^{2+}$, $Sr^{2+}$, $Ba^{2+}$, and $Zn^{2+}$; the value is the total content of these) and further contains, in terms of anion %, 10 to 65% $F^-$ and 35 to 90% $O^{2-}$.

In the case where the glass to be used as the transparent substrate is a phosphate glass, this glass preferably contains, in terms of mass %, 30 to 80% $P_2O_5$, 1 to 20% $Al_2O_3$, 0.5 to 30% $R_2O$ (where $R_2O$ is at least one of $Li_2O$, $Na_2O$, and $K_2O$; the value is the total content of these), 1 to 12% CuO, and 0.5 to 40% RO (where RO is at least one of MgO, CaO, SrO, BaO, and ZnO; the value is the total content of these).

Examples of commercial products of the glass include: NF-50E, NF-50EX, NF-50T, and NF-50TX (trade names; manufactured by Asahi Glass Co., Ltd.); BG-60 and BG-61 (trade names; manufactured by Schott AG); and CD 5000 (trade name; manufactured by HOYA Corp.).

The CuO-containing glasses described above may further contain metal oxides. In the case where a CuO-containing glass contains one or more metal oxides selected from among, for example, $Fe_2O_3$, $MoO_3$, $WO_3$, $CeO_2$, $Sb_2O_3$, $V_2O_5$, and the like, this glass has ultraviolet-absorbing properties. The contents of these metal oxides per 100 parts by mass of the CuO-containing glass are preferably as follows: at least one metal oxide selected from the group consisting of $Fe_2O_3$, $MoO_3$, $WO_3$, and $CeO_2$ is contained so as to result in at least one of an $Fe_2O_3$ content of 0.6 to 5 parts by mass, an $MoO_3$ content of 0.5 to 5 parts by mass, a $WO_3$ content of 1 to 6 parts by mass, and a $CeO_2$ content of 2.5 to 6 parts by mass; or two metal oxides, i.e., $Fe_2O_3$ and $Sb_2O_3$, are contained so that the $Fe_2O_3$ content is 0.6 to 5 parts by mass and the $Sb_2O_3$ content is 0.1 to 5 parts by mass; or two metal oxides, i.e., $V_2O_5$ and $CeO_2$, are contained so that the $V_2O_5$ content is 0.01 to 0.5 parts by mass and the $CeO_2$ content is 1 to 6 parts by mass.

(Reflection Layer)

In this filter, a reflection layer is an optional constituent element. The reflection layer is constituted of a dielectric multilayer film and has the function of cutting off light having wavelengths within a specific range. Examples of the reflection layer include a layer having wavelength selectivity to transmit visible light and mainly reflect light having wavelengths outside the range where light is cut off by the absorption layer. In this case, the range where light is reflected by the reflection layer may include a cutting-off range in the near-infrared range where light is cut off by the absorption layer. The properties of the reflection layer are not limited to the properties described above, and the reflection layer may be designed in accordance with a constitution for cutting off light having wavelengths in a given range.

In the case where this filter includes a reflection layer, this reflection layer preferably has such reflection characteristics that the transmittance of light having a wavelength equal to the maximum-absorption wavelength $\lambda_{max(AI)}$ of the NIR dye (AI) is 1% or less. This configuration synergistically enables this filter to have high light-blocking properties (high OD value) at the maximum-absorption wavelength $\lambda_{max(AI)}$ of the NIR dye (AI).

This filter may include one reflection layer or may include two or more reflection layers. In the configuration including two or more reflection layers, these layers may be the same or different. In the case of the configuration including two or more reflection layers, the configuration may have a combination in which one layer is a near-infrared-reflecting layer that cuts off at least near-infrared light and, in particular, has the reflection characteristics described above, and another layer is an ultraviolet-reflecting layer that reflects at least ultraviolet light.

The reflection layer is constituted of a dielectric multilayer film formed by alternately stacking a dielectric film having a low refractive index (low-refractive-index film) and a dielectric film having a high refractive index (high-refractive-index film). Examples of materials for the high-refractive-index film include $Ta_2O_5$, $TiO_2$, and $Nb_2O_5$. Among these, $TiO_2$ is preferred from the standpoints of reproducibility, stability, etc. regarding film-forming property, refractive index, etc. Examples of materials for the low-refractive-index film include $SiO_2$ and $SiO_xN_y$. $SiO_2$ is preferred from the standpoints of reproducibility, stability, profitability, etc. regarding film-forming property. The film thickness of the reflection layer is preferably 2 to 10 µm.

(Anti-Reflection Layer)

Examples of the anti-reflection layer include a dielectric multilayer film, an intermediate-refractive-index medium, and a moth-eye structure having a refractive index which changes gradually. Among these, a dielectric multilayer film is preferred from the standpoints of the high efficiency of light utilization and productivity.

Due to the absorption layer containing the NIR dye (AI), this filter can have excellent light-blocking properties in a longer-wavelength near-infrared region and can have high visible-light-transmitting properties. This filter can be used, for example, in imaging devices of digital still cameras, and ambient-light sensors.

An imaging device employing this filter includes a solid imaging element, an imaging lens, and this filter. This filter can be disposed, for example, between the imaging lens and the solid imaging element or can be used in the state of being directly adhered to the solid imaging element, the imaging lens, or another component of the imaging device via an adhesive layer.

EXAMPLES

Example 1

Using scheme (F1), NIR dye (A1-7) was produced as an NIR dye (AI). The structure of the dye (A1-7) is shown in Table 1. In producing the dye (A1-7), 2,1,3-benzothiadiazole procured from Tokyo Chemical Industry Co., Ltd. was used as a starting material, i.e., compound (a) in scheme (F1).

(Production of Compound (b))

In accordance with the following scheme, compound (b) was produced from compound (a). Into a flask equipped with a reflux device, 25.0 g (183.7 mmol) of compound (a) and 150 mL of 48% hydrobromic acid were introduced. The contents were heated to 100° C., and 8.5 mL (165.4 mmol) of bromine was then added dropwise thereto. The resultant mixture was stirred at 100° C. for 9 hours and allowed to cool. After completion of the reaction, 200 mL of dichloromethane was added to dissolve a precipitated solid, and 100 mL of an aqueous solution of sodium sulfite was further added. The organic layer was recovered, washed with saturated aqueous sodium hydrogen carbonate solution, and dried with anhydrous sodium sulfate. Thereafter, the solvent was removed under reduced pressure to obtain unpurified compound (b). This compound was suspended in 200 mL of hexane/ethyl acetate (4:1 by volume), and the solid remaining undissolved was taken out by filtration to thereby remove 4,7-dibromo-2,1,3-benzothiadiazole being a by-product.

The filtrate was concentrated again and suspended in 200 mL of hexane, and the solid remaining undissolved was taken out by filtration to thereby obtain 11.2 g of 4-bromo-2,1,3-benzothiadiazole as compound (b). Furthermore, the filtrate was concentrated and purified by column chromatography using hexane/ethyl acetate (97:3 by volume) as a developer, thereby obtaining 8.0 g of compound (b). The total yield was 54%.

[Chem. 10]

(Production of Compound (c))

The compound (b) obtained above was used to produce compound (c) in accordance with the following scheme. Into a flask equipped with a reflux device, 0.20 g (1.44 mmol) of PEPPSI™-IPr, 2.98 g (Br equivalent: 14.5 mmol) of the compound (b) (containing 8.0 mol % dibromo-form), 1.95 g (17.4 mmol) of t-butoxypotassium, and 60 mL of toluene were introduced. After degassing and nitrogen displacement, 2.75 mL (16.0 mmol) of diisobutylamine was added thereto and the resultant mixture was stirred at 100° C. for 5 hours. After completion of the reaction, the solid in the liquid reaction mixture was removed by Celite filtration, and the filtrate was concentrated to obtain unpurified compound (c). This compound was purified by column chromatography using hexane/ethyl acetate (24:1 by volume) as a developer to obtain 2.60 g of compound (c). The yield was 79%.

[Chem. 11]

(Production of Compound (d))

The compound (c) obtained above was used to produce compound (d) in accordance with the following scheme. Into a flask equipped with a reflux device, 2.60 g (9.9 mmol) of the compound (c), 100 mL of THF, and 0.94 g (24.7 mmol) of lithium aluminum hydride were introduced. In a nitrogen atmosphere, refluxing was conducted at 75° C. for 1 hour. Thereafter, 0.9 mL of water, 0.9 mL of 15% aqueous sodium hydroxide solution, and 2.8 mL of water were successively added with cooling with ice to terminate the reaction. The solid in the liquid reaction mixture was removed by filtration, and the filtrate was concentrated to obtain unpurified compound (d).

[Chem. 12]

(Production of Compound (e))

The compound (d) obtained above was used to produce compound (e) in accordance with the following scheme. Into a flask equipped with a reflux device, the compound (d) obtained above and 50 mL of 98% formic acid were introduced. Refluxing was conducted at 100° C. for 2 hours. After completion of the reaction, the formic acid was removed under reduced pressure. To the residue, 50 mL of ethyl acetate and 50 mL of saturated aqueous sodium hydrogen carbonate solution were added. The organic layer was recovered and dried with anhydrous sodium sulfate, and the solvent was then removed under reduced pressure to obtain unpurified compound (e). This compound was purified by column chromatography using hexane/ethyl acetate (2:1 by volume) as a developer to obtain 2.1 g of compound (e). The yield based on the compound (c) was 87%.

[Chem. 13]

(d)

(e)

(Production of NIR Dye (A1-7))

The compound (e) obtained above was used to produce NIR dye (AI-7) in accordance with the following scheme. Into a flask equipped with a reflux device and a water separator, 0.2 g (0.82 mmol) of the compound (e), 0.06 g (0.41 mmol) of croconic acid, 1.5 mL of toluene, and 1.5 mL of 1-butanol were introduced. Refluxing was conducted at 125° C. for 3 hours with stirring. After completion of the reaction, the solvents were removed under reduced pressure to obtain unpurified NIR dye (A1-7). This dye was purified by column chromatography using hexane/ethyl acetate (2:8 by volume) as a developer to obtain 0.14 g of NIR dye (A1-7). The yield was 56%.

[Chem. 14]

(Al-7)

Example 2

NIR dye (A3-2), the structure of which is shown in Table 1, was produced as an NIR dye (AI) by the following method. The compound (13) used as a starting material in producing NIR dye (A3-2) had been produced by the method described in WO 14/088063.

(Production of Compound (γ))

In accordance with the following scheme, compound (γ) was produced from compound (β). Into a flask, 10.0 g (52.83 mmol) of compound (β) and 200 mL of DMF were introduced. The contents were cooled to 0° C., and 9.40 g (52.83 mmol) of N-bromosuccinimide ("NB S" in the scheme) was gradually added thereto. The mixture was reacted at 0° C. for 1 hour, and 200 mL of water was then added. The reaction mixture was subjected to extraction with a hexane/ethyl acetate=1/1 solution, and the extract was washed with water and dried with sodium sulfate. Thereafter, the solvent was removed under reduced pressure to obtain 14.0 g of unpurified compound (γ).

[Chem. 15]

(β)    (γ)

(Production of Compound (δ))

The compound (γ) obtained above was used to produce compound (δ) in accordance with the following scheme. Into a flask, 13.57 g (50.60 mmol) of the compound (γ) was introduced. In a 0° C. ice bath, 70.0 g of concentrated sulfuric acid was rapidly added dropwise to the contents of the flask and the resultant mixture was stirred for 30 minutes. Thereafter, a mixed acid composed of 6.38 g (60.72 mmol) of 60% concentrated nitric acid and 18.86 g (192.27 mmol) of concentrated sulfuric acid was added dropwise thereto in the ice bath. The mixture was returned to room temperature and stirred for 1 hour. After completion of the reaction, the liquid reaction mixture was dropped into 100 mL of ice-water while occasionally adding ice thereto and 40% aqueous sodium hydroxide solution was then added dropwise until the mixture became basic. After the solution was ascertained with a pH-test paper to have become basic, 500 mL of a hexane/ethyl acetate=1/1 solution was added thereto.

The organic layer was recovered and dried with anhydrous sodium sulfate. Thereafter, the solvent was removed under reduced pressure to obtain unpurified compound (δ). This compound was purified by column chromatography using hexane/ethyl acetate (9:1 by volume) as a developer, thereby obtaining 14.0 g of compound (δ). The yield based on the compound (β) was 88%.

[Chem. 16]

(γ)

(δ)

(Production of Compound (ε))

The compound (δ) obtained above was used to produce compound (ε) in accordance with the following scheme. Into a flask, 5.0 g (15.96 mmol; Mw, 313.19) of the compound (δ) and 50 mL of THF were introduced. In a nitrogen atmosphere, 40.5 mL (57.46 mmol) of 1.42-M vinylmagnesium chloride was added thereto at −40° C. The contents were stirred at −40° C. for 1 hour, and 50 mL of saturated aqueous ammonium chloride solution was then added thereto to terminate the reaction. The reaction mixture was returned to room temperature, and 50 mL of water was then added thereto. The resultant mixture was subjected to extraction with a hexane/ethyl acetate=1/1 solution. The extract was washed with saturated aqueous sodium chloride solution and dried with sodium sulfate, and the solvent was then removed under reduced pressure, thereby obtaining unpurified compound (ε).

[Chem. 17]

(δ)

(ε)

(Production of Compound (ζ))

The compound (ε) obtained above was used to produce compound (ζ) in accordance with the following scheme. Into a flask, the compound (ε) obtained above and 30 mL of THF were introduced. The contents were cooled to 0° C., and 1.0 g of palladium-carbon, 90 mL of methanol, and 5.03 g (79.8 mmol) of ammonium formate were added thereto. The mixture was stirred at room temperature for 1 hour, and 100 mL of water was then added. Thereafter, the reaction solution was subjected to Celite filtration, and the methanol and the THF were removed from the filtrate under reduced pressure. Ethyl acetate was added to the residue, and the resultant mixture was subjected to liquid separation. The organic layer was recovered and dried with sodium sulfate, and the solvent was then removed under reduced pressure to obtain unpurified compound (ζ). This compound was subjected to column purification using hexane/ethyl acetate=4/1, thereby obtaining 1.10 g of compound (ζ). The yield based on the compound (δ) was 30%.

[Chem. 18]

(ε)

(ζ)

(Production of NIR Dye (A3-2))

The compound (ζ) obtained above was used to produce NIR dye (A3-2) in accordance with the following scheme. Into a flask equipped with a reflux device and a water separator, 0.24 g (1.1 mmol) of the compound (ζ), 0.07 g (0.5 mmol) of croconic acid, 1.5 mL of toluene, and 1.5 mL of 1-butanol were introduced. Refluxing was conducted at 125° C. for 1 hour with stirring. After completion of the reaction, the solvents were removed under reduced pressure to obtain unpurified NIR dye (A3-2). This dye was washed with ethyl acetate and then purified by column chromatography using dichloromethane/methanol (97:3 by volume) as a developer, thereby obtaining 0.05 g of NIR dye (A3-2). The yield was 15%.

[Chem. 19]

(A3-2)

<Evaluation of the NIR Dyes>

(1) Absorption Characteristics of the Dyes in Dichloromethane

Figure 2:
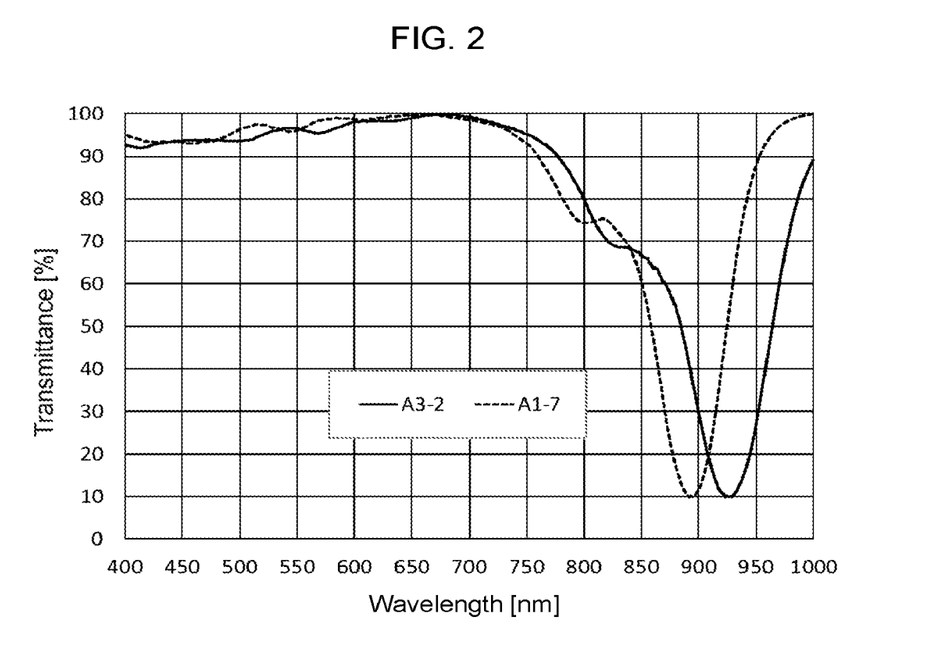
FIG. 2 is a chart illustrating spectral transmittance curves of the croconium compounds obtained in the Examples.

The NIR dye (A1-7) and NIR dye (A3-2) obtained above were each dissolved in dichloromethane and measured for spectral transmittance curve (400 to 1,100 nm) using an ultraviolet-visible spectrophotometer (UV-3100, manufactured by Shimadzu Corp.). The spectral transmittance curves obtained with the solutions each prepared so as to have a light transmittance of 10% at the maximum-absorption wavelength $\lambda_{max}$ are shown in FIG. 2.

The maximum-absorption wavelength $\lambda_{max}$ of the NIR dye (A1-7) was 892 nm.

The maximum-absorption wavelength $\lambda_{max}$ of the NIR dye (A3-2) was 924 nm.

The NIR dye (A1-7) solution had an average transmittance of light having a wavelength of 430 to 480 nm being 93.4%, when the solution had a light transmittance of 10% at the maximum-absorption wavelength $\lambda_{max}$ of the NIR dye (A1-7).

The NIR dye (A3-2) solution had an average transmittance of light having a wavelength of 430 to 480 nm being 93.7%, when the solution had a light transmittance of 10% at the maximum-absorption wavelength $\lambda_{max}$ of the NIR dye (A3-2).

The NIR dye (A1-7) solution had an average transmittance of light having a wavelength of 410 to 480 nm being 93.4%, when the solution had a light transmittance of 10% at the maximum-absorption wavelength $\lambda_{max}$ of the NIR dye (A1-7).

The NIR dye (A3-2) solution had an average transmittance of light having a wavelength of 410 to 480 nm being 93.4%, when the solution had a light transmittance of 10% at the maximum-absorption wavelength $\lambda_{max}$ of the NIR dye (A3-2).

INDUSTRIAL APPLICABILITY

Since the near-infrared-absorbing dye of the present invention renders excellent light-blocking properties possible in a longer-wavelength near-infrared region and has high visible-light-transmitting properties, this dye is applicable to optical filters for cutting off near-infrared light, in particular, relatively longer-wavelength components of near-infrared light. This dye is usable also in absorption layers for ambient-light sensors. The optical filter of the present invention is applicable to imaging devices.

REFERENCE SIGNS LIST 10A, 10B . . . optical filter, 11 . . . absorption layer, 12 . . . transparent substrate, 13 . . . reflection layer, 14 . . . anti-reflection layer.

The invention claimed is:

1. A near-infrared-absorbing dye comprising a croconium-based compound represented by formula (AI):

(AI)

wherein ring Z is an optionally substituted 5-membered ring comprising at least one nitrogen atom or sulfur atom as a heteroatom in the ring, $R^1$ and $R^2$, $R^2$ and $R^3$, and $R^1$ and a carbon atom or heteroatom as a part of the ring Z may be linked to each other to respectively form a heteroring A, a heteroring B, and a heteroring C together with a nitrogen atom; in a case where the heteroring(s) is not formed, IV and $R^2$ each independently represent a hydrogen atom or a hydrocarbon group which may contain an unsaturated bond, a heteroatom, or a saturated or unsaturated ring structure between carbon atoms and which may be substituted, and $R^3$ each independently represents a hydrogen atom, a halogen atom, a hydroxyl group, or an alkyl or alkoxy group which may contain a heteroatom between carbon atoms, and $R^4$ each independently represents a hydrogen atom, a halogen atom, a hydroxyl group, or an alkyl or alkoxy group which may contain a heteroatom between carbon atoms.

2. The near-infrared-absorbing dye according to claim 1, wherein the ring Z is an aromatic ring.

3. The near-infrared-absorbing dye according to claim 1, wherein the ring Z is each independently a pyrrolidine ring, a pyrrole ring, a thiophene ring, an imidazole ring, a pyrazole ring, a thiazole ring, an isothiazole ring, an oxazole ring, an isoxazole ring, or a triazole ring.

4. The near-infrared-absorbing dye according to claim 3, wherein the ring Z is each independently a pyrrole ring, an imidazole ring, a pyrazole ring, or a triazole ring.

5. The near-infrared-absorbing dye according to claim 4, wherein a hydrogen atom of a —NH— portion contained as a part of the pyrrole ring, the imidazole ring, the pyrazole ring, or the triazole ring is unsubstituted and a nitrogen atom of the —NH—portion is bonded to a 2-position carbon atom of a benzene ring in the croconium-based compound.

6. The near-infrared-absorbing dye according to claim 1, having $\lambda_{max(AI)}$ within a range of from 800 to 1,000 nm,
wherein the $\lambda_{max(AI)}$ is a maximum-absorption wavelength in an absorption spectrum over a wavelength range of from 400 to 1,100 nm measured after dissolving the near-infrared-absorbing dye into dichloromethane.

7. The near-infrared-absorbing dye according to claim 1, wherein when a dichloromethane solution has a regulated concentration of the near-infrared-absorbing dye so as to have a transmittance of light at a maximum-absorption wavelength $\lambda_{max(AI)}$ of the near-infrared-absorbing dye being 10%, the dichloromethane solution has an average transmittance of light having a wavelength of from 430 to 480 nm being 90% or higher.

8. The near-infrared-absorbing dye according to claim 7, wherein when the dichloromethane solution has a regulated concentration of the near-infrared-absorbing dye so as to have a transmittance of light at the maximum-absorption wavelength $\lambda_{max(AI)}$ of the near-infrared-absorbing dye being 10%, the dichloromethane solution has an average transmittance of light having a wavelength of from 410 to 480 nm being 90% or higher.

9. An optical filter comprising an absorption layer, wherein the absorption layer comprises a near-infrared-absorbing dye (AI) that is the near-infrared-absorbing dye according to claim 1, and a resin.

10. The optical filter according to claim 9, wherein the absorption layer further comprises a near-infrared-absorbing dye (AII) having $\lambda_{max(AII)}$ within a range of 660 nm or longer and [(maximum-absorption wavelength $\lambda_{max(AI)}$ of the near-infrared-absorbing dye (AI))-30] nm or shorter,
wherein the $\lambda_{max(AII)}$ is a maximum-absorption wavelength in an absorption spectrum over a wavelength range of from 400 to 1,100 nm measured after dissolving the near-infrared-absorbing dye (AII) into dichloromethane.

11. The optical filter according to claim 10, wherein the near-infrared-absorbing dye (AII) comprises at least one selected from the group consisting of cyanine-based compounds, phthalocyanine-based compounds, naphthalocyanine-based compounds, dithiol metal complex compounds, diimonium-based compounds, polymethine-based compounds, phthalide compounds, naphthoquinone-based compounds, anthraquinone-based compounds, indophenol-based compounds, and squarylium-based compounds.

12. The optical filter according to claim 9, further comprising a reflection layer, wherein the reflection layer comprises a dielectric multilayer film.

13. The optical filter according to claim 12, wherein the reflection layer has a transmittance of light at a maximum-absorption wavelength $\lambda_{max(AI)}$ of the near-infrared-absorbing dye (AI) being 1% or less.

14. The optical filter according to claim 9, further comprising a transparent substrate, wherein the absorption layer is provided on the transparent substrate.

15. The optical filter according to claim 14, wherein the transparent substrate is made of glass.

16. The optical filter according to claim 15, wherein the glass is a near-infrared-absorbing glass.

17. The optical filter according to claim 14, wherein the transparent substrate is made of a resin.

18. The optical filter according to claim 9, wherein the absorption layer functions as a resinous base.

19. An imaging device comprising a solid imaging element, an imaging lens, and the optical filter according to claim 9.

* * * * *